(12) United States Patent
Byun et al.

(10) Patent No.: US 12,330,434 B2
(45) Date of Patent: Jun. 17, 2025

(54) DROPLET DISCHARGING APPARATUS, DROPLET DISCHARGING METHOD AND MANUFACTURING METHOD FOR DISPLAY DEVICE

(71) Applicant: Samsung Display Co., LTD., Yongin-si (KR)

(72) Inventors: Jungwoong Byun, Osan-si (KR); Toshinaru Suzuki, Suwon-si (KR); Cheong-Wan Min, Hwaseong-si (KR); Jeongwon Han, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 180 days.

(21) Appl. No.: 17/826,831

(22) Filed: May 27, 2022

(65) Prior Publication Data
US 2023/0072141 A1 Mar. 9, 2023

(30) Foreign Application Priority Data
Sep. 9, 2021 (KR) .................. 10-2021-0120436

(51) Int. Cl.
*B41J 29/393* (2006.01)
*B41J 2/04* (2006.01)
(Continued)

(52) U.S. Cl.
CPC ............. *B41J 29/393* (2013.01); *B41J 2/04* (2013.01); *G06T 7/0004* (2013.01); *H10K 71/135* (2023.02); *G06T 2207/30144* (2013.01)

(58) Field of Classification Search
CPC ......... B41J 29/393; B41J 2/04; H10K 71/135; G06T 7/0004
See application file for complete search history.

(56) References Cited

U.S. PATENT DOCUMENTS

2007/0070099 A1* 3/2007 Beer .................... B41J 11/0035
347/8
2010/0087015 A1* 4/2010 Britt .................. H01L 31/03928
257/E31.001

(Continued)

FOREIGN PATENT DOCUMENTS

KR   10-2016-0131667   11/2016
KR   10-2018-0021647   3/2018
(Continued)

*Primary Examiner* — Jason S Uhlenhake
(74) *Attorney, Agent, or Firm* — KILE PARK REED & HOUTTEMAN PLLC

(57) ABSTRACT

A droplet discharging apparatus may include a transfer part moving a substrate including a first target position in a first direction, an inkjet head disposed on the transfer part and discharging a first droplet to the first target position of the substrate, a first camera positioned in a second direction opposite to the first direction of the inkjet head, the first camera acquiring a first image corresponding to the first target position of the substrate, a second camera positioned in the first direction of the inkjet head, the second camera acquiring a second image corresponding to the first target position of the substrate, and an image processor receiving the first image and the second image, and comparing the first image and the second image to inspect a discharge state of the first droplet.

20 Claims, 13 Drawing Sheets

(51) Int. Cl.
*G06T 7/00* (2017.01)
*H10K 71/13* (2023.01)

(56) References Cited

U.S. PATENT DOCUMENTS

| | | | | |
|---|---|---|---|---|
| 2013/0050325 A1* | 2/2013 | Takahashi | ............ | B41J 2/04563 |
| | | | | 347/14 |
| 2015/0259784 A1* | 9/2015 | Goto | .................... | B41J 2/04581 |
| | | | | 427/8 |
| 2015/0373305 A1* | 12/2015 | Hauf | ..................... | G06T 7/0004 |
| | | | | 118/712 |

FOREIGN PATENT DOCUMENTS

| | | |
|---|---|---|
| KR | 10-2018-0102490 | 9/2018 |
| KR | 20180102490 A * | 9/2018 |
| KR | 10-1953464 | 2/2019 |

\* cited by examiner

DROPLET DISCHARGING APPARATUS, DROPLET DISCHARGING METHOD AND MANUFACTURING METHOD FOR DISPLAY DEVICE

CROSS-REFERENCE TO RELATED APPLICATION(S)

This application claims priority to and benefits of Korean Patent Application No. 10-2021-0120436 under 35 U.S.C. § 119, filed on Sep. 9, 2021 in the Korean Intellectual Property Office, the entire contents of which are incorporated herein by reference.

BACKGROUND

1. Technical Field

Embodiments of the disclosure relate to a droplet discharging apparatus used in a printing process, a droplet discharging method used in a printing process, and a manufacturing method for a display device.

2. Description of the Related Art

In manufacturing a display device, an emitting layer, a monomer layer of a thin film encapsulation structure, a color filter layer, and the like may be formed through a printing process.

The printing process may be performed in such a way that an inkjet head disposed on a two-dimensional plane spaced apart from a substrate by a distance discharges a droplet onto the substrate. The substrate may have an opening capable of accommodating the droplet. The droplet discharged from the inkjet head may impact the opening.

In the related art, a state of the droplet may be inspected before performing the printing process, but there is a problem in that it is not possible to check whether the droplet impacts during the printing process.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide a droplet discharging apparatus capable of checking whether the droplet impacts while the printing process may be performed.

Embodiments of the disclosure also provide a droplet discharging method capable of checking whether the droplet impacts while the printing process may be performed.

Embodiments of the disclosure also provide a manufacturing method for a display device including the droplet discharging method.

Additional features of the disclosure will be set forth in the description which follows, and in part will be apparent from the description, or may be learned by practice of the disclosure.

A droplet discharging apparatus according to an embodiment may include a transfer part moving a substrate including a first target position in a first direction, an inkjet head disposed on the transfer part and discharging a first droplet to the first target position of the substrate, a first camera positioned in a second direction opposite to the first direction of the inkjet head, the first camera acquiring a first image corresponding to the first target position of the substrate, a second camera positioned in the first direction of the inkjet head, the second camera acquiring a second image corresponding to the first target position of the substrate, and an image processor receiving the first image and the second image, and comparing the first image and the second image to inspect a discharge state of the first droplet.

In an embodiment, the first camera may acquire the first image at a first timing, the inkjet head may discharge the first droplet at a second timing later than the first timing, and the second camera may acquire the second image at a third timing later than the second timing.

In an embodiment, at the first timing, the second timing, and the third timing, the transfer part may be moving the substrate in the first direction.

In an embodiment, the first image may be an image corresponding to the first target position before the first droplet may be discharged, and the second image may be an image corresponding to the first target position after the first droplet may be discharged.

In an embodiment, the substrate may further include a second target position spaced apart from the first target position in the second direction, the first camera may acquire a third image corresponding to the second target position of the substrate, the inkjet head may discharge a second droplet to the second target position of the substrate, the second camera may acquire a fourth image corresponding to the second target position of the substrate, and the image processor may receive the third image and the fourth image, and may compare the third image and the fourth image to inspect a discharge state of the second droplet.

In an embodiment, the first camera may acquire the third image at a fourth timing later than the first timing, the inkjet head may discharge the second droplet at a fifth timing later than the fourth timing, and the second camera may acquire the fourth image at a sixth timing later than the fifth timing.

In an embodiment, the first camera, the inkjet head, and the second camera may be physically connected to each other and fixed.

In an embodiment, each of the first camera and the second camera may be a line scan camera that photographs in units of lines.

In an embodiment, each of the first camera and the second camera may be an area scan camera that photographs in units of areas.

In an embodiment, the droplet discharging apparatus may further include a controller communicating with the image processor and stopping a printing process in case that it is determined that the first droplet is not seated at the first target position.

In an embodiment, a direction in which the first camera and the second camera photograph may be a third direction perpendicular to the substrate.

In an embodiment, the droplet discharging apparatus may further include an illumination including a light source irradiating light in a direction intersecting the third direction, and a half mirror reflecting the light in the third direction.

In an embodiment, the second camera may receive a first reflected light reflected by the substrate, the second camera receives a second reflected light reflected by the first droplet, the first reflected light may have a first intensity, and the second reflected light may have a second intensity greater than the first intensity.

A droplet discharging method according to an embodiment may include moving a substrate including a first target position in a first direction, acquiring a first image corresponding to the first target position of the substrate at a first timing, discharging a first droplet to the first target position of the substrate at a second timing, acquiring a second image corresponding to the first target position of the substrate at a third timing, and comparing the first image and the second image to inspect a discharge state of the first droplet.

In an embodiment, at the first timing, the second timing, and the third timing, the substrate may be moved in the first direction.

In an embodiment, the first image may be an image corresponding to the first target position before the first droplet may be discharged, and the second image may be an image corresponding to the first target position after the first droplet may be discharged.

In an embodiment, the droplet discharging method may further include stopping a printing process in case that it is determined that the first droplet is not seated at the first target position.

In an embodiment, the droplet discharging method may further include acquiring a third image corresponding to a second target position of the substrate, the second target position spaced apart from the first target position in a second direction opposite to the first direction, discharging a second droplet to the second target position of the substrate, acquiring a fourth image corresponding to the second target position of the substrate, and comparing the third image and the fourth image to inspect a discharge state of the second droplet.

A manufacturing method for a display device according to an embodiment may include forming an anode electrode on a base substrate, forming a pixel defining layer on the base substrate, the pixel defining layer having an opening exposing the anode electrode, moving the base substrate in a first direction, acquiring a first image corresponding to the opening of the base substrate, forming an emission layer by discharging a droplet including an organic light emitting material into the opening of the base substrate, acquiring a second image corresponding to the opening of the base substrate, and comparing the first image and the second image to inspect a discharge state of the droplet.

In an embodiment, the first image may be an image corresponding to the opening before the droplet may be discharged, and the second image may be an image corresponding to the opening after the droplet may be discharged.

According to the droplet discharging apparatus, the droplet discharging method, and the manufacturing method of the display device according to embodiments of the disclosure, in the time period during which the printing process may be performed, an image corresponding to the target position may be acquired immediately before the droplet may be discharged to the target position, another image corresponding to the target position may be acquired immediately after the droplet may be discharged to the target position, and the images may be compared. Accordingly, it may be possible to check in real time whether the droplet impacts while the printing process may be performed.

It is to be understood that both the foregoing general description and the following detailed description are examples and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the disclosure.

DETAILED DESCRIPTION OF THE EMBODIMENTS

Figure 1:
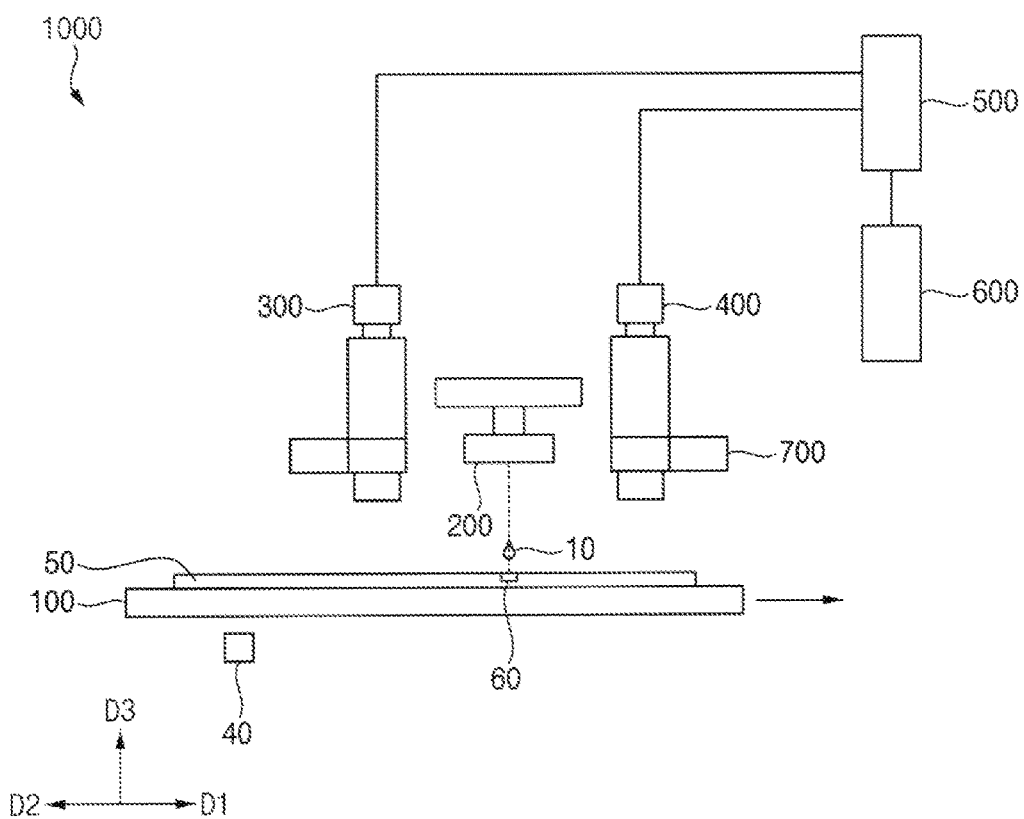
FIG. 1 is a schematic view illustrating a droplet discharging apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
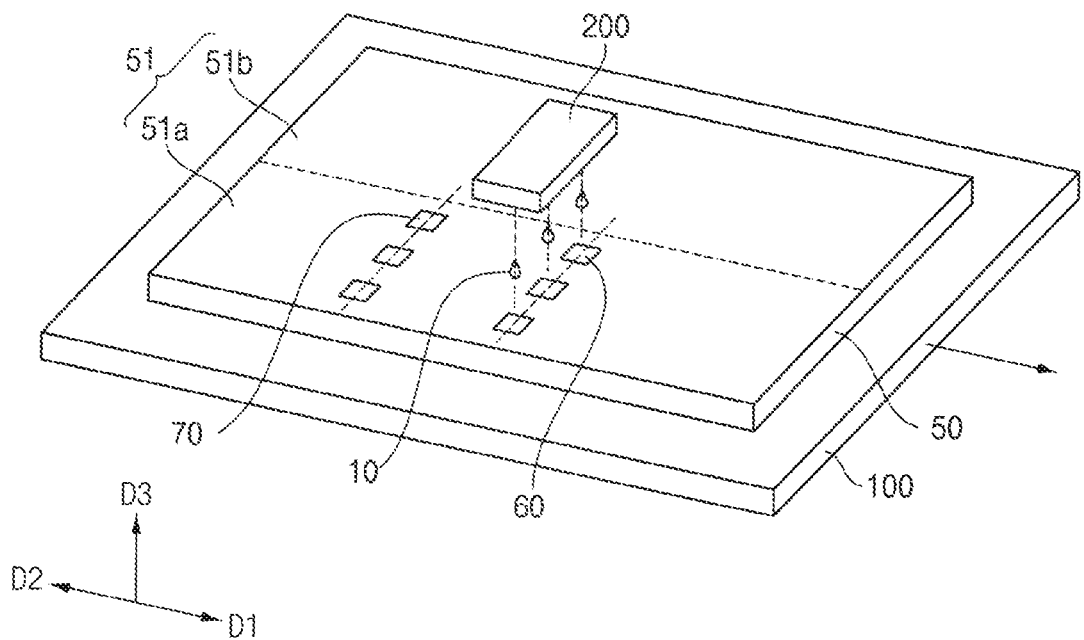
FIG. 2 is a schematic perspective view illustrating an example of a transfer part and an inkjet head included in the droplet discharging apparatus of FIG. 1.
Figure 3:
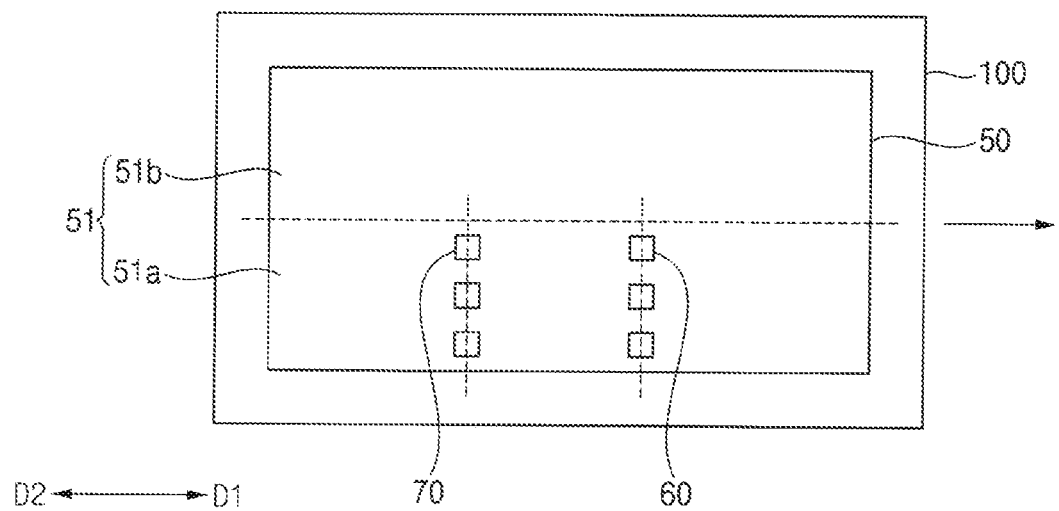
FIG. 3 is a schematic plan view illustrating an example of the transfer part of FIG. 2.
Figure 4:
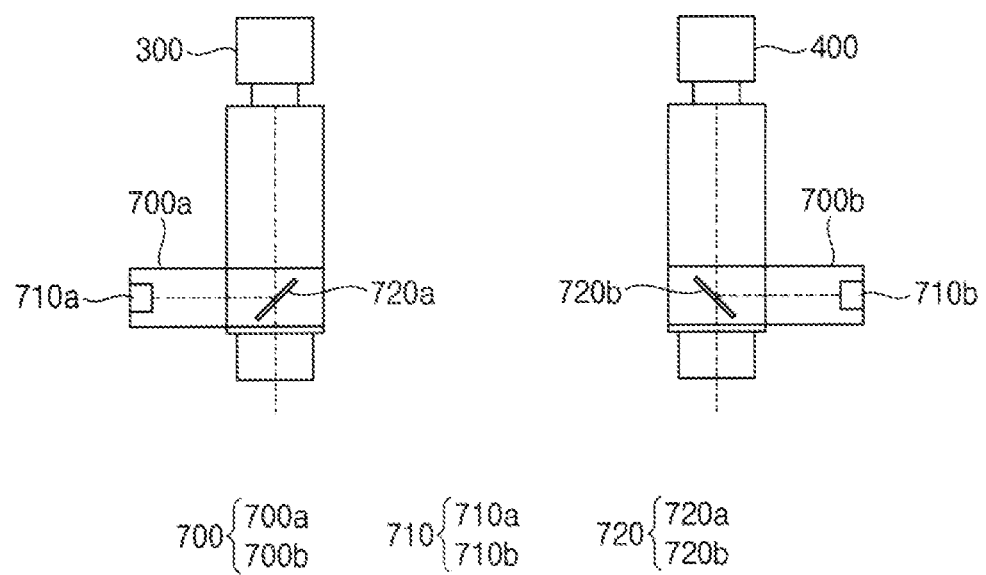
FIG. 4 is a schematic view illustrating an example of an illumination included in the droplet discharging apparatus of FIG. 1.

FIG. 1 is a schematic view illustrating a droplet discharging apparatus according to an embodiment. FIG. 2 is a schematic perspective view illustrating an example of a transfer part and an inkjet head included in the droplet discharging apparatus of FIG. 1. FIG. 3 is a schematic plan view illustrating an example of the transfer part of FIG. 2. FIG. 4 is a schematic view illustrating an example of an illumination included in the droplet discharging apparatus of FIG. 1.

Referring to FIGS. 1 to 4, a droplet discharging apparatus 1000 according to an embodiment may include a transfer part 100, an inkjet head 200, a first camera 300, a second camera 400, an image processor 500, a controller 600, and an illumination 700.

The transfer part 100 may transfer a substrate 50 in a first direction D1. Although it has been described that the transfer part 100 can transfer the substrate 50 in the first direction D1, embodiments are not limited thereto. For example, the transfer part 100 may transfer the substrate 50 in a direction different from the first direction D1. For example, the transfer part 100 may reciprocally transfer the substrate 50 in the first direction D1 and in a second direction D2 opposite to the first direction D1.

The inkjet head 200 may be disposed on the transfer part 100. The inkjet head 200 may discharge a droplet to the substrate 50 transferred by the transfer part 100.

The substrate 50 may include a first area 51a. The first area 51a may be a target area from which the droplet may be discharged while the transfer part 100 moves the substrate 50 in the first direction D1.

The substrate 50 may further include a second area 51b different from the first area 51a. The second area 51b may be a target area from which the droplet may be discharged while the transfer part 100 moves the substrate 50 in the second direction D2.

FIG. 2 illustrates that the first area 51a and the second area 51b constitute an upper surface 51 of the substrate 50, but embodiments are not limited thereto. For example, the upper surface 51 may be constituted with more areas.

Hereinafter, for convenience of understanding, it may be assumed that the transfer part 100 moves the substrate 50 in the first direction D1. Accordingly, a process in which the inkjet head 200 discharges the droplet to the second area 51b of the substrate 50 will not be described, but those skilled in the art will be able to easily understand the process.

In case that the inkjet head 200 discharges the droplet, the substrate 50 may receive the droplet. The inkjet head 200 may discharge the droplet multiple times while the transfer part 100 moves the substrate 50 in the first direction D1.

The droplet may include a first droplet 10. The first droplet 10 may be a droplet discharged by the inkjet head 200 at any of the multiple times. The first droplet 10 may be plural.

The substrate 50 may include a first target position 60. The first target position 60 may be positioned in the first area 51a of the substrate 50. The first target position 60 may be a position where the substrate 50 can receive the first droplet 10. If the first droplet 10 may be plural, the first target position 60 may also be plural. The first target position 60 may mean a position that may be parallel to each other in a direction crossing the first direction D1.

Figure 13:
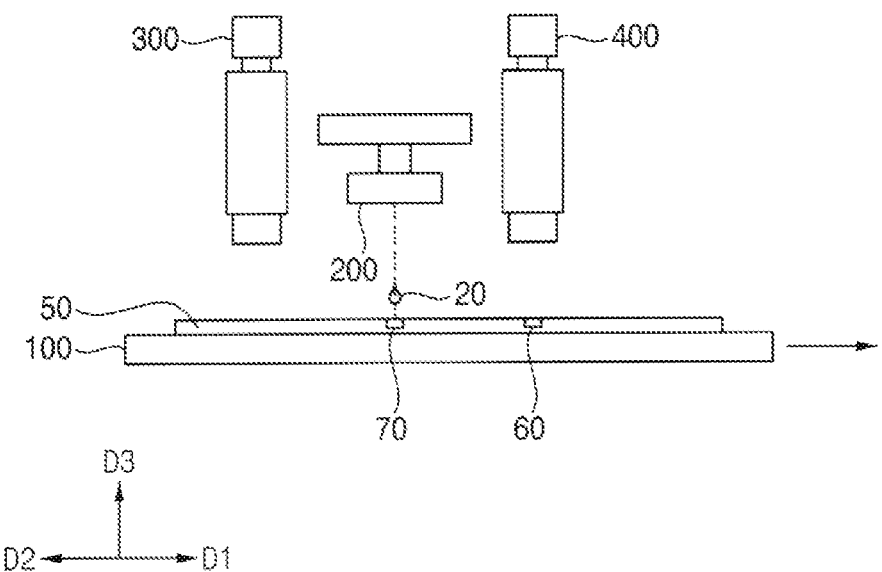

The droplet may further include a second droplet (e.g., a second droplet 20 of FIG. 13). The second droplet may be a droplet discharged by the inkjet head 200 at another of the multiple times. The second droplet may be plural.

The substrate 50 may further include a second target position 70 spaced apart from the first target position 60 in the second direction D2. The second target position 70 may be positioned in the first area 51a of the substrate 50. The second target position 70 may be a position where the substrate 50 can receive the second droplet. If the second droplet is plural, the second target position 70 may also be plural. The second target position 70 may mean another position that may be parallel to each other in a direction crossing the first direction D1.

The first camera 300 may be positioned in the second direction D2 of the inkjet head 200. The first camera 300 may acquire a first image (e.g., a first image 301a of FIG. 8) corresponding to the first target position 60 of the substrate 50. The first image may be an image corresponding to the first target position 60 before the first droplet 10 may be discharged.

The second camera 400 may be positioned in the first direction D1 of the inkjet head 200. The second camera 400 may acquire a second image (e.g., a second image 401a of FIG. 9) corresponding to the first target position 60 of the substrate 50. The second image may be an image corresponding to the first target position 60 after the first droplet 10 may be discharged. The first image and the second image will be described in detail later.

In an embodiment, the inkjet head 200, the first camera 300, and the second camera 400 may be connected to each other and fixed. For example, the first camera 300, the inkjet head 200, and the second camera 400 may be supported by a support (not illustrated).

In another embodiment, the inkjet head 200, the first camera 300, and the second camera 400 may be fixed while being separated from each other. For example, the inkjet head 200 may be supported by a support (not illustrated), the first camera 300 may be supported by another support (not illustrated), and the second camera 400 may be supported by another support (not illustrated).

A direction in which the first camera 300 and the second camera 400 photograph may be a third direction D3 perpendicular to the substrate 50.

In an embodiment, each of the first camera 300 and the second camera 400 may be a line scan camera that photographs in units of lines. Each of the first image and the second image may be photographed in units of lines.

In another embodiment, each of the first camera 300 and the second camera 400 may be an area scan camera that photographs in units of areas. Each of the first image and the second image may be photographed in units of areas.

The image processor 500 may inspect a discharge state of the droplet discharged from the inkjet head 200. The image processor 500 may receive the first image and the second image, and may compare the first image and the second image to inspect the discharge state (e.g., impact or not) of the first droplet 10.

The controller 600 may communicate with the image processor 500. The controller 600 may control the transfer part 100 and the inkjet head 200. A printing process may be performed by controlling the transfer part 100 and the inkjet head 200.

The illumination 700 may irradiate light to the substrate 50. In an embodiment, as illustrated in FIG. 4, the illumination 700 may include a first illumination 700a connected to the first camera 300 and a second illumination 700b connected to the second camera 400.

The illumination 700 may include a light source 710 and a half mirror 720. The light source 710 may include a first light source 710a installed in the first illumination 700a and a second light source 710b installed in the second illumination 700b. The half mirror 720 may include a first half mirror 720a installed in the first illumination 700a and a second half mirror 720b installed in the second illumination 700b.

The first light source 710a may irradiate light in a direction crossing the third direction D3. The first half mirror 720a may reflect the light in the third direction D3. The light may be reflected by the substrate 50 to reach the first camera 300. The first camera 300 may receive a first reflected light reflected by the substrate 50. The first camera 300 may include a first image sensor. The first image sensor may sense the first reflected light.

Similarly, the second light source 710b may irradiate light in a direction crossing the third direction D3. The second half mirror 720b may reflect the light in the third direction D3. The light may be reflected by the substrate 50 or the droplet to reach the second camera 400. The second camera 400 may receive a second reflected light reflected by the substrate 50 or the droplet. The second camera 400 may include a second image sensor. The second image sensor may sense the second reflected light.

The second reflected light may be divided into a second-first reflected light reflected by the substrate 50 and a second-second reflected light reflected by the droplet.

The first camera 300 may receive the first reflected light reflected by the substrate 50. The second camera 400 may receive the second-first reflected light reflected by the substrate 50 and the second-second reflected light reflected by the droplet. The second-second reflected light may be light reflected by the first droplet 10 or the second droplet.

Each of the first reflected light and the second-first reflected light reflected by the substrate 50 may have a first intensity. The first intensity may vary according to a wavelength of the light irradiated from the light source 710.

The second-second reflected light reflected by the droplet may have a second intensity. The second intensity may vary according to the wavelength of the light irradiated from the light source 710.

The light source 710 may have a target wavelength range. In case that the light having the target wavelength range is irradiated from the light source 710, the first intensity may be smaller than the second intensity. For example, the target wavelength range may be a wavelength range in which a difference between the first intensity and the second intensity may be relatively large.

As will be described later in detail with reference to FIG. 9, the second image (e.g., the second image 401a of FIG. 9) may include a first portion in which the first droplet 10 appears and a second portion in which the substrate 50 appears. In case that the light having the target wavelength range is irradiated from the light source 710, the first portion in which the first droplet 10 appears may appear brighter than the second portion in which the substrate 50 appears. Accordingly, in the second image, the first portion and the second portion may be clearly distinguished.

Figure 5:
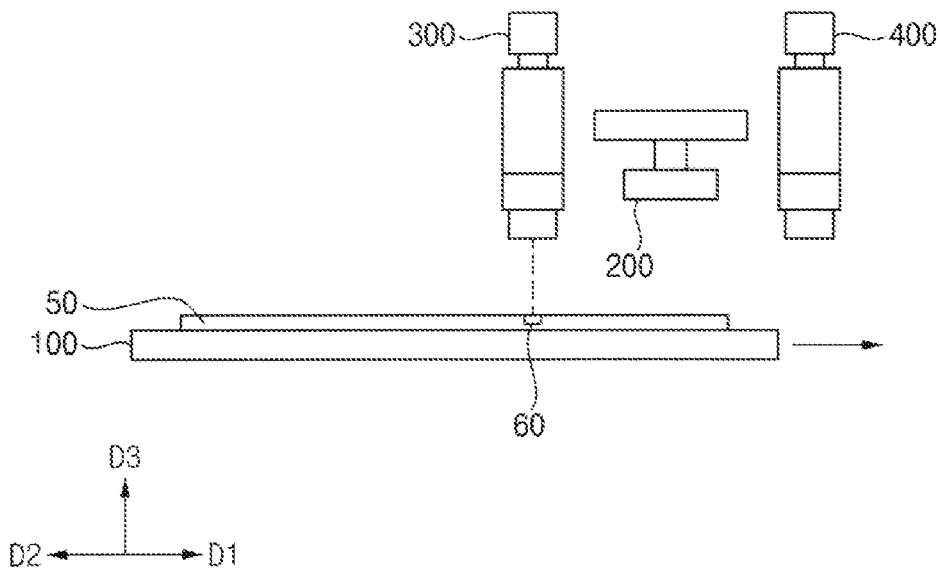
FIGS. 5 to 7 are schematic views for explaining an operation of the droplet discharging apparatus of FIG. 1.
Figure 6:
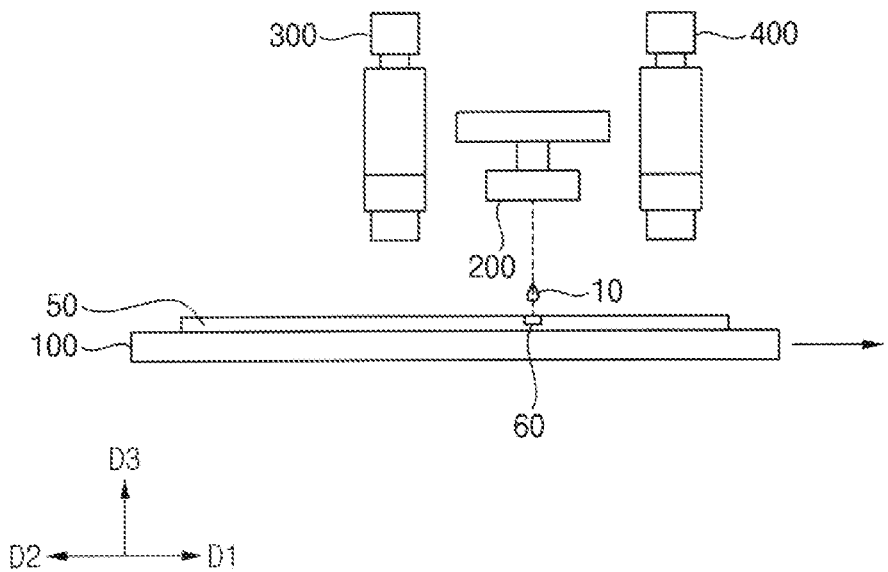
Figure 7:
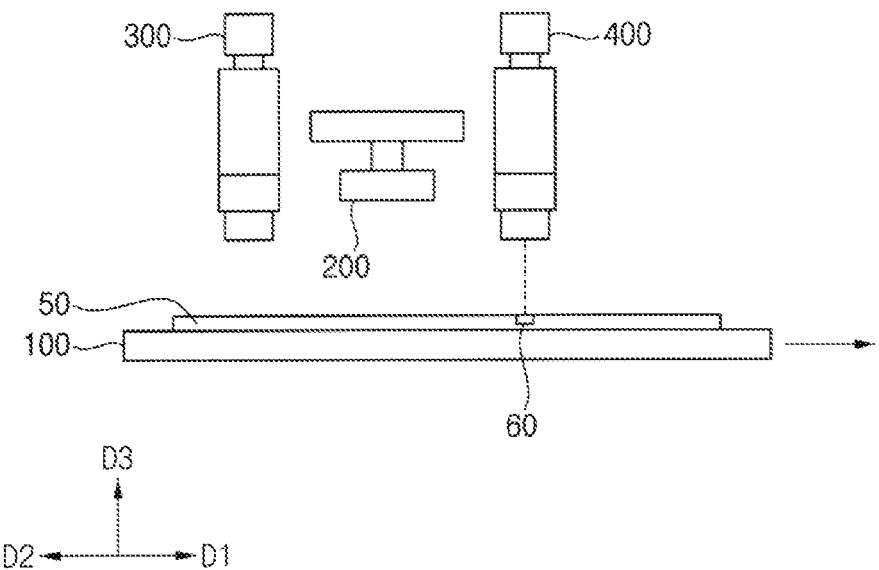
Figure 8:
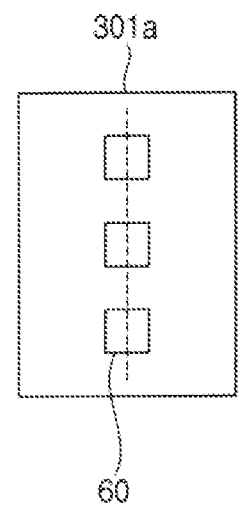
FIG. 8 is a schematic view illustrating a first image acquired by a first camera of FIG. 5.

FIGS. 5 to 7 are schematic views for explaining an operation of the droplet discharging apparatus of FIG. 1. FIG. 8 is a schematic view illustrating a first image acquired by the first camera of FIG. 5. FIG. 9 is a schematic view illustrating a second image acquired by the second camera of FIG. 7.

Hereinafter, with reference to FIGS. 5 to 9, a droplet discharging method using the droplet discharging apparatus 1000 according to an embodiment will be described.

Referring to FIGS. 5 to 7, the transfer part 100 may transfer the substrate 50 in the first direction D1. Accordingly, the first camera 300 and the second camera 400 may photograph the first target position 60 of the substrate 50 at different timings. For example, the first camera 300 may photograph the first target position 60 of the substrate 50 earlier than the second camera 400.

Specifically, as illustrated in FIG. 5, the first camera 300 may acquire the first image 301a corresponding to the first target position 60 at a first timing. At the first timing, the substrate 50 may be moving in the first direction D1 by the transfer part 100.

As illustrated in FIGS. 5 and 8, the first image 301a may be an image corresponding to the first target position 60 before the first droplet 10 may be discharged. In other words, a scene in which the first droplet 10 does not impact the first target position 60 of the substrate 50 may appear in the first image 301a.

As illustrated in FIG. 6, the inkjet head 200 may discharge the first droplet 10 at a second timing later than the first timing. The first droplet 10 may impact the first target position 60 of the substrate 50. At the second timing, the substrate 50 may be moving in the first direction D1 by the transfer part 100.

As illustrated in FIG. 7, the second camera 400 may acquire the second image 401a corresponding to the first target position 60 at a third timing later than the second timing. At the third timing, the substrate 50 may be moving in the first direction D1 by the transfer part 100.

Figure 9:
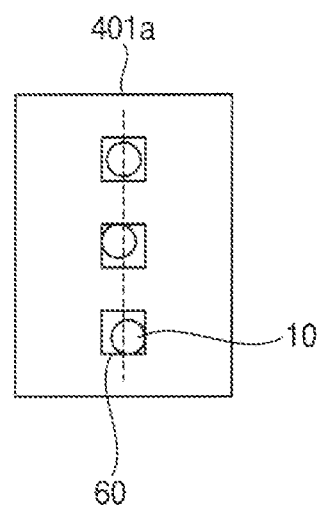
FIG. 9 is a schematic view illustrating a second image acquired by a second camera of FIG. 7.

As illustrated in FIGS. 7 and 9, the second image 401a may be an image corresponding to the first target position 60 after the first droplet 10 may be discharged. In other words, a scene in which the first droplet 10 impacts the first target position 60 of the substrate 50 may appear in the second image 401a.

The image processor 500 may receive the first image 301a and the second image 401a, and compare the first image 301a and the second image 401a to inspect a discharge state (e.g., impact or not) of the first droplet 10. For example, the image processor 500 may compare the first image 301a and the second image 401a to check whether the first droplet 10 may be properly seated at the first target position 60. In case that it is determined that the first droplet 10 is not seated at the first target position 60, the controller 600 may stop the printing process.

In an embodiment, as illustrated in FIG. 1, there may be an encoder 40 around the transfer part 100. The encoder 40 may detect an operation of the transfer part 100. The encoder 40 may be used to coordinate a moving speed of the transfer part 100 and a shooting speed of the first camera 300 and the second camera 400.

Figure 10:
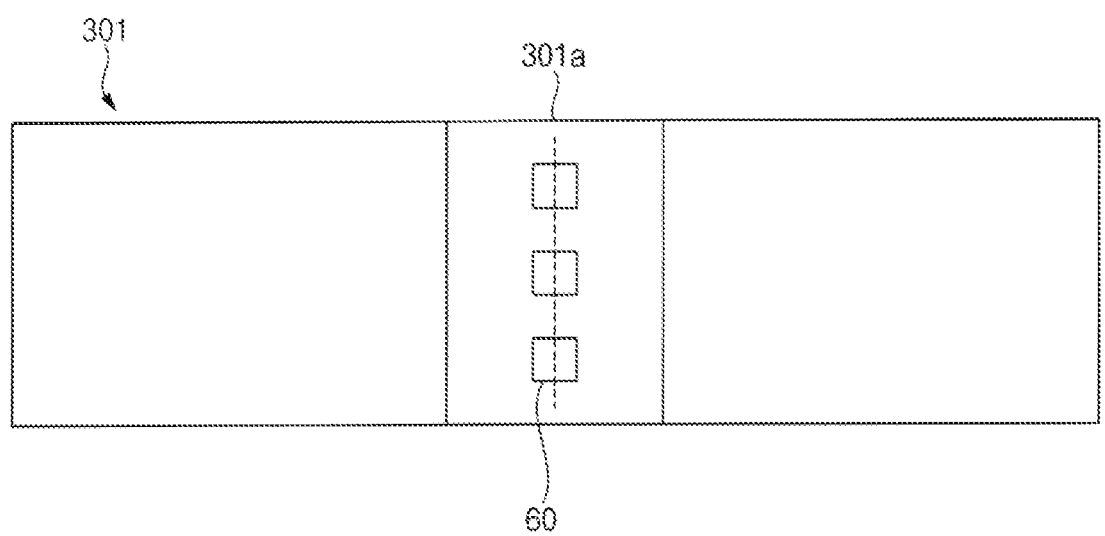
FIG. 10 is a schematic view illustrating an example of a first full image including the first image of FIG. 8.
Figure 11:
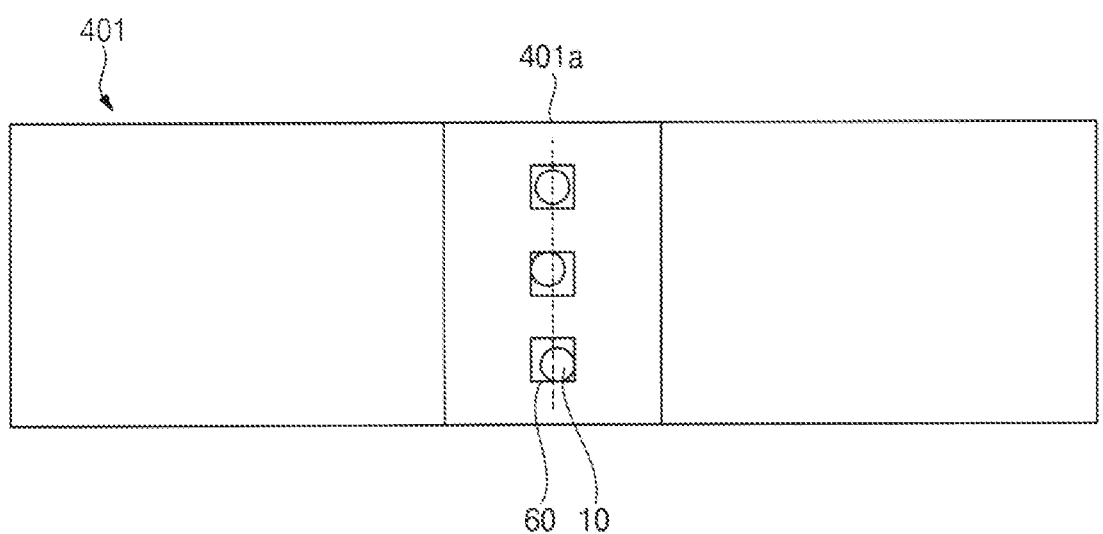
FIG. 11 is a schematic view illustrating an example of a second full image including the second image of FIG. 9.

FIG. 10 is a schematic view illustrating an example of a first full image including the first image of FIG. 8. FIG. 11 is a schematic view illustrating an example of a second full image including the second image of FIG. 9.

Referring to FIGS. 2, 8 and 10, the first camera 300 may acquire a first full image 301 corresponding to the first area 51a of the substrate 50 by photographing the substrate 50.

Since the first target position 60 may be positioned in the first area 51a of the substrate 50, the first full image 301 acquired by the first camera 300 may include the first image 301a.

Referring to FIGS. 2, 9 and 11, the second camera 400 may acquire a second full image 401 corresponding to the first area 51a of the substrate 50 by photographing the substrate 50.

Since the first target position 60 may be positioned in the first area 51a of the substrate 50, the second full image 401 acquired by the second camera 400 may include the second image 401a.

Figure 12:
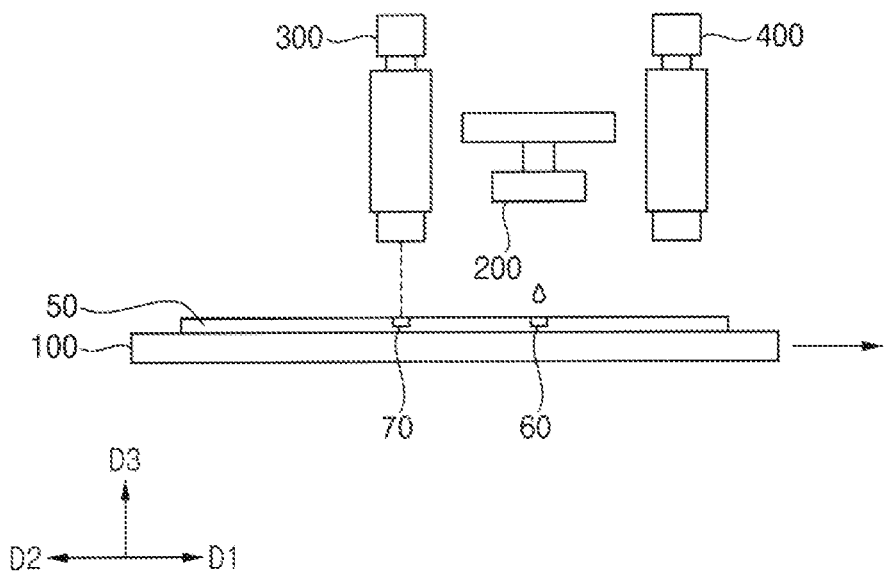
FIGS. 12 to 14 are schematic views for explaining an additional operation of the droplet discharging apparatus of FIG. 1.
Figure 14:
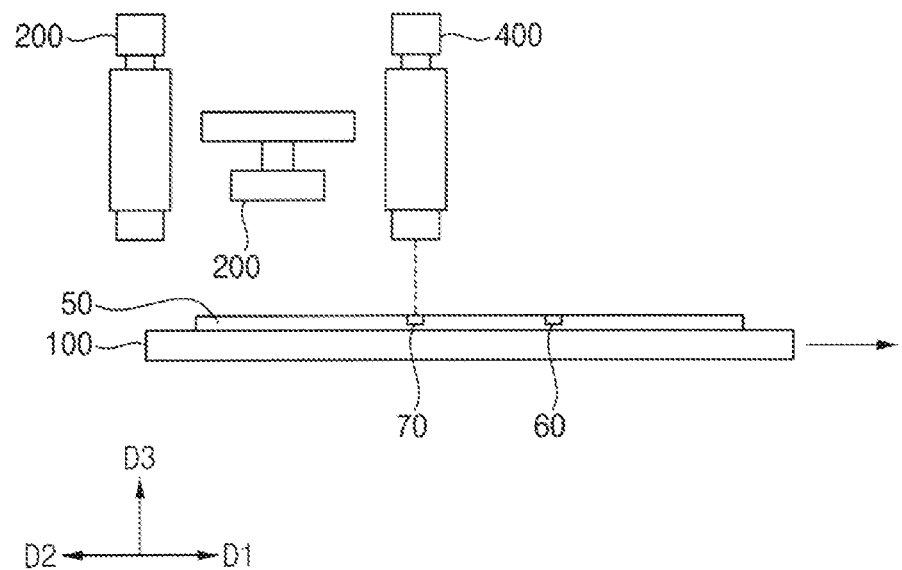
Figure 15:
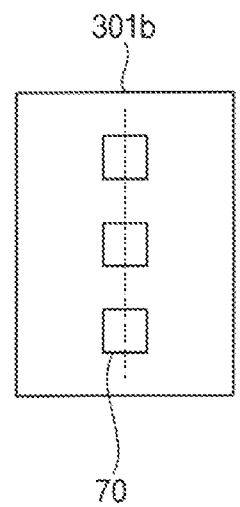
FIG. 15 is a schematic view illustrating a third image acquired by a first camera of FIG. 12.
Figure 16:
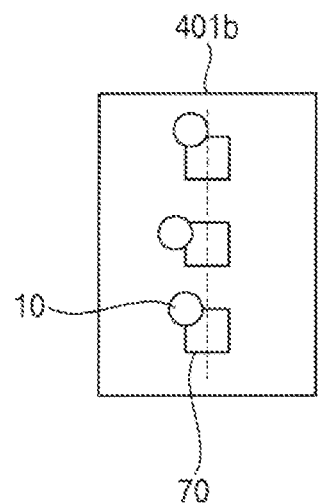
FIG. 16 is a schematic view illustrating a fourth image acquired by a second camera of FIG. 14.

FIGS. 12 to 14 are schematic views for explaining an additional operation of the droplet discharging apparatus of FIG. 1. FIG. 15 is a schematic view illustrating a third image acquired by a first camera of FIG. 12. FIG. 16 is a schematic view illustrating a fourth image acquired by a second camera of FIG. 14.

Referring to FIG. 12, the first camera 300 may acquire the third image 301b corresponding to the second target position 70 at a fourth timing later than the first timing. At the fourth timing, the substrate 50 may be moving in the first direction D1 by the transfer part 100.

As illustrated in FIG. 15, the third image 301b may be an image corresponding to the second target position 70 before the second droplet 20 may be discharged. In other words, a scene in which the second droplet 20 does not impact the second target position 70 of the substrate 50 may appear in the third image 301b.

Referring to FIG. 13, the inkjet head 200 may discharge the second droplet 20 at a fifth timing later than the fourth timing. The second droplet 20 may impact the second target position 70 of the substrate 50. At the fifth timing, the substrate 50 may be moving in the first direction D1 by the transfer part 100.

Referring to FIG. 14, the second camera 400 may acquire the fourth image 401b corresponding to the second target position 70 at a sixth timing later than the fifth timing. At the sixth timing, the substrate 50 may be moving in the first direction D1 by the transfer part 100.

As illustrated in FIG. 16, the fourth image 401b may be an image corresponding to the second target position 70 after the second droplet 20 may be discharged. In other words, a scene in which the second droplet 20 impacts the second target position 70 of the substrate 50 may appear in the fourth image 401b.

The image processor 500 may receive the third image 301b and the fourth image 401b, and compare the third image 301b and the fourth image 401b to inspect a discharge state (e.g., impact or not) of the second droplet 20. For example, the image processor 500 may compare the third image 301b and the fourth image 401b to check whether the second droplet 20 may be properly seated at the second target position 70. In case that it is determined that the second droplet 20 is not seated at the second target position 70, the controller 600 may stop the printing process.

Figure 17:
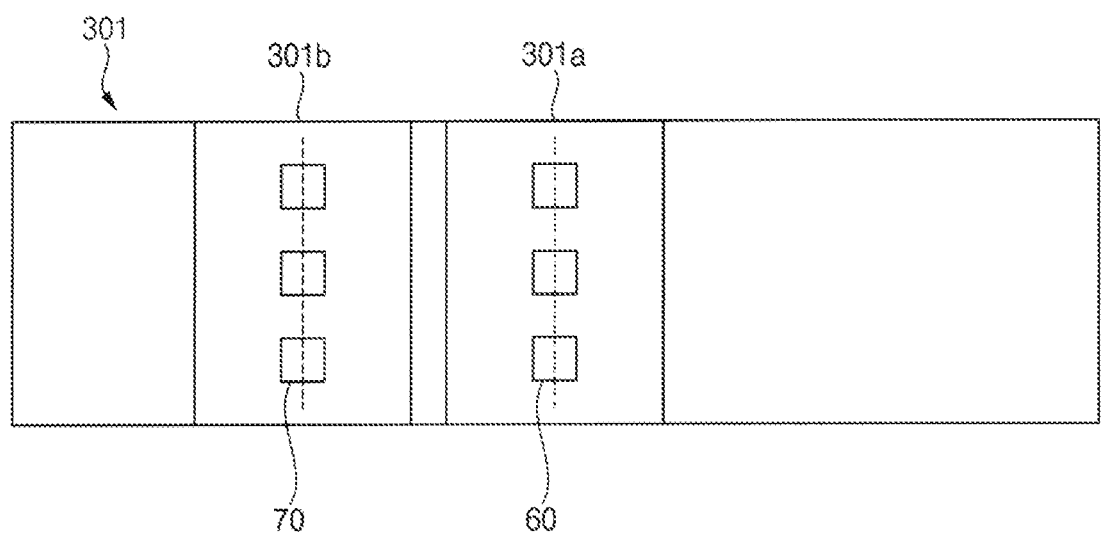
FIG. 17 is a schematic view illustrating an example of a first full image further including a third image of FIG. 15.
Figure 18:
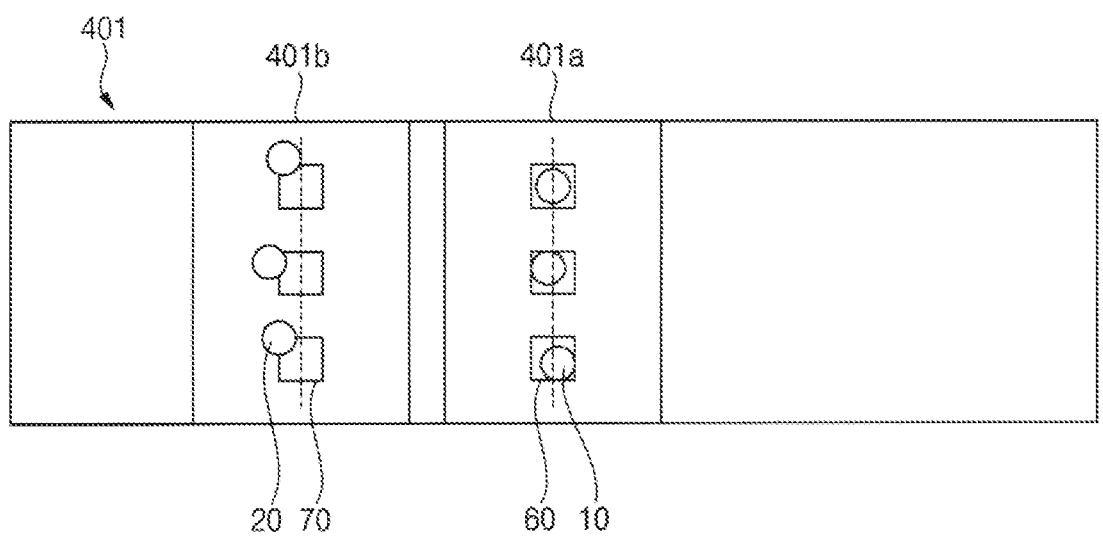
FIG. 18 is a schematic view illustrating an example of a second full image further including a fourth image of FIG. 16.

FIG. 17 is a schematic view illustrating an example of a first full image further including a third image of FIG. 15. FIG. 18 is a schematic view illustrating an example of a second full image further including a fourth image of FIG. 16.

Referring to FIGS. 2, 15 and 17, the first camera 300 may acquire a first full image 301 corresponding to the first area 51a of the substrate 50 by photographing the substrate 50.

Since the second target position 70 may be positioned in the first area 51a of the substrate 50, the first full image 301 acquired by the first camera 300 may further include the third image 301b.

Referring to FIGS. 2, 16 and 18, the second camera 400 may acquire a second full image 401 corresponding to the first area 51a of the substrate 50 by photographing the substrate 50.

Since the second target position 70 may be positioned in the first area 51a of the substrate 50, the second full image 401 acquired by the second camera 400 may further include the second image 401b.

FIGS. 19 to 22 are schematic views illustrating a manufacturing method for a display device according to an embodiment.

Figure 19:
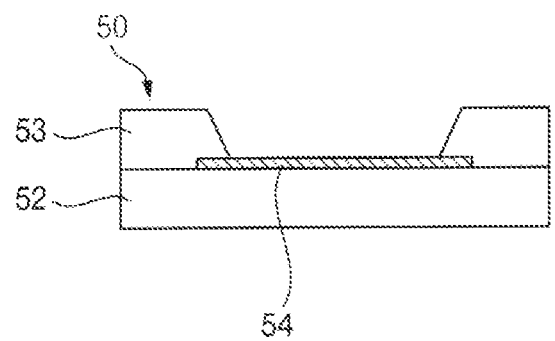
FIGS. 19 to 22 are schematic views illustrating a manufacturing method for a display device according to an embodiment.

First, referring to FIG. 19, an anode electrode 54 may be formed on a base substrate 52. Although not illustrated in the views, a thin film transistor layer may be formed between the base substrate 52 and the anode electrode 54. The thin film transistor layer may include at least one thin film transistor and an insulating layer.

A pixel defining layer 53 having an opening exposing the anode electrode 54 may be formed on the base substrate 52.

Figure 20:
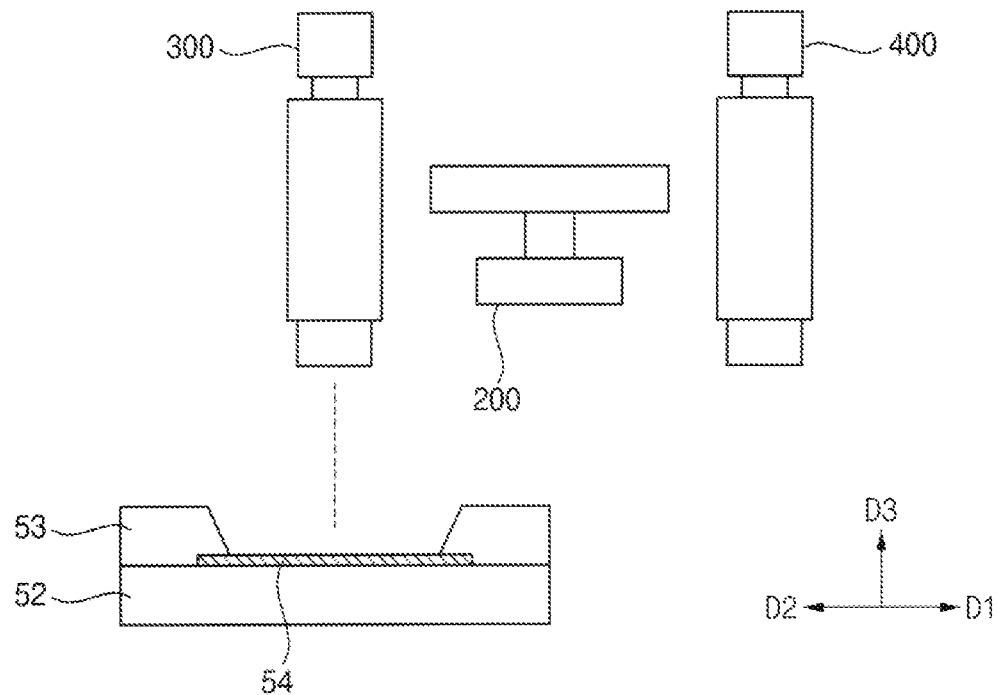
Figure 21:
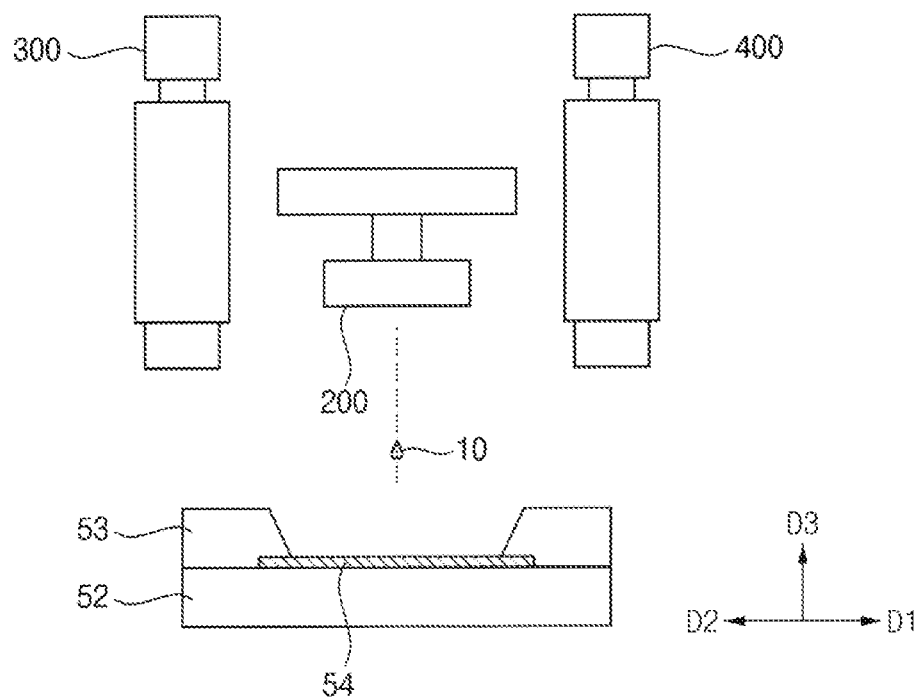

Referring to FIGS. 20 and 21, an emission layer 55 may be formed by discharging a first droplet 10 including an organic light emitting material into the opening of the pixel defining layer 53. The first droplet 10 may be discharged by the droplet discharging apparatus 1000 of FIGS. 1 to 4. The opening may mean the first target position (e.g., the first target position 60 of FIG. 1).

Before the emission layer 55 may be formed, the base substrate 52 may be moved in the first direction D1. For example, the transfer part (e.g., the transfer part 100 of FIG. 2) may move the base substrate 52 in the first direction D1. Accordingly, the first camera 300 and the second camera 400 may photograph the opening of the pixel defining layer 53 at different timings. For example, the first camera 300 may photograph the opening of the pixel defining layer 53 earlier than the second camera 400.

Specifically, as illustrated in FIG. 20, the first camera 300 may acquire a first image corresponding to the opening of the pixel defining layer 53 at a first timing. At the first timing, the base substrate 52 may be moving in the first direction D1 by the transfer part 100.

The first image may be an image corresponding to the opening of the pixel defining layer 53 before the first droplet 10 may be discharged. In other words, a scene in which the first droplet 10 does not impact the opening of the pixel defining layer 53 may appear in the first image.

As illustrated in FIG. 21, the inkjet head 200 may discharge the first droplet 10 at a second timing later than the first timing. The first droplet 10 may impact the opening of the pixel defining layer 53. Accordingly, the emission layer 55 may be formed in the opening of the pixel defining layer 53. At the second timing, the base substrate 52 may be moving in the first direction D1 by the transfer part 100.

Figure 22:
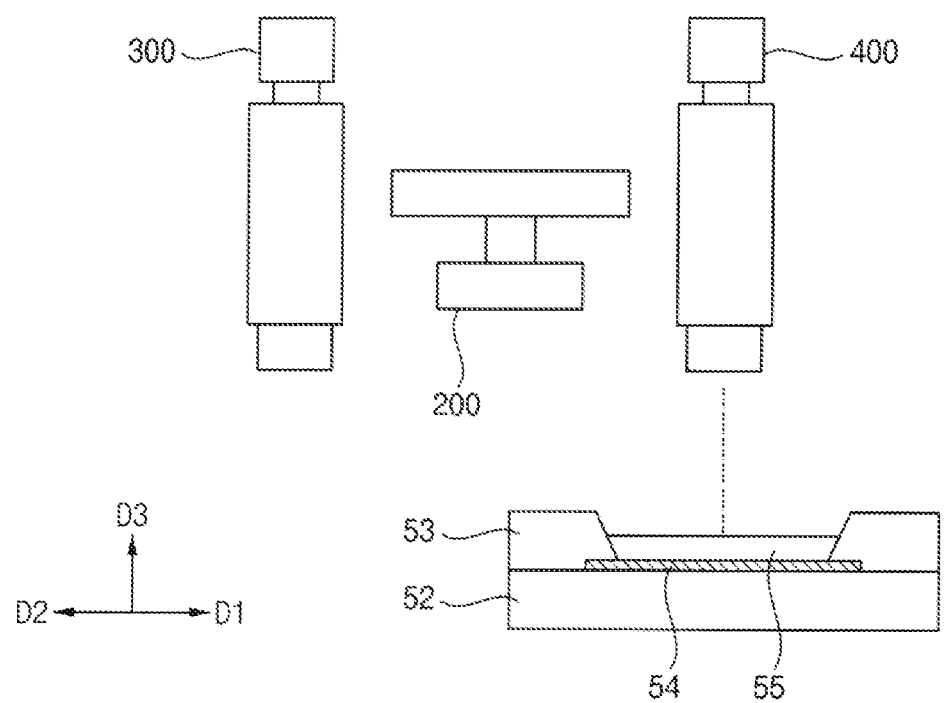

Referring to FIG. 22, the second camera 400 may acquire a second image corresponding to the opening of the pixel defining layer 53 at a third timing later than the second timing. At the third timing, the base substrate 52 may be moving in the first direction D1 by the transfer part 100.

The second image may be an image corresponding to the opening of the pixel defining layer 53 after the first droplet 10 may be discharged. In other words, a scene in which the first droplet 10 impacts the opening of the pixel defining layer 53 may appear in the second image.

The image processor 500 (e.g., the image processor 500 of FIG. 1) may receive the first image and the second image, and compare the first image and the second image to inspect a discharge state (e.g., impact or not) of the first droplet 10. For example, the image processor 500 may compare the first image and the second image to check whether the first droplet 10 may be properly seated at the first target position 60. In case that it is determined that the first droplet 10 is not seated at the opening of the pixel defining layer 53, the controller 600 (e.g., the controller 600 of FIG. 1) may stop the printing process.

In the related art, a state of the droplet was inspected before performing the printing process, but there is a problem in that it is not possible to check whether the droplet is impacted during the printing process.

However, according to the droplet discharging apparatus 1000, the droplet discharging method, and the manufacturing method of the display device according to embodiments of the disclosure, in the time period during which the printing process may be performed, an image (e.g., the first image 301a) corresponding to a target position (e.g., a first target position 60) may be acquired immediately before a droplet (e.g., a first droplet 10) may be discharged to the target position, another image (e.g., the second image 401a) corresponding to the target position may be acquired immediately after the droplet may be discharged to the target position, and the images (e.g., the first image 301a and the second image 401a) may be compared. Accordingly, it may be possible to check in real time whether the droplet may be impacted while the printing process may be performed.

If it is determined that the droplet is not seated at the target position, the printing process may be stopped. Accordingly, it may be possible to minimize the product to be thrown away due to poor impact, and unnecessary processes may not be performed.

Although certain embodiments and implementations have been described herein, other embodiments and modifications will be apparent from this description. Accordingly, the disclosure is not limited to such embodiments, but rather to the broader scope of the appended claims and various obvious modifications and equivalent arrangements as would be apparent to a person of ordinary skill in the art.

What is claimed is:

1. A droplet discharging apparatus comprising:
a transfer part moving a substrate including a first target position in a first direction;
an inkjet head disposed on the transfer part and discharging a first droplet to the first target position of the substrate;
a first camera positioned in a second direction opposite to the first direction of the inkjet head, the first camera acquiring a first image corresponding to the first target position of the substrate;
a second camera positioned in the first direction of the inkjet head, the second camera acquiring a second image corresponding to the first target position of the substrate; and
an image processor receiving the first image and the second image, and comparing the first image and the second image to inspect a discharge state of the first droplet and determine if the first droplet is seated within a boundary of the first target position, the boundary defining an enclosed area corresponding to a diameter size of the first droplet when seated on the substrate.

2. The droplet discharging apparatus of claim 1, wherein
the first camera acquires the first image at a first timing,
the inkjet head discharges the first droplet at a second timing later than the first timing, and
the second camera acquires the second image at a third timing later than the second timing.

3. The droplet discharging apparatus of claim 2, wherein at the first timing, the second timing, and the third timing, the transfer part is moving the substrate in the first direction.

4. The droplet discharging apparatus of claim 2, wherein
the first image is an image corresponding to the first target position before the first droplet is discharged, and
the second image is an image corresponding to the first target position after the first droplet is discharged.

5. The droplet discharging apparatus of claim 2, wherein
the substrate further includes a second target position spaced apart from the first target position in the second direction,
the first camera acquires a third image corresponding to the second target position of the substrate,
the inkjet head discharges a second droplet to the second target position of the substrate,
the second camera acquires a fourth image corresponding to the second target position of the substrate, and
the image processor receives the third image and the fourth image, and compares the third image and the fourth image to inspect a discharge state of the second droplet.

6. The droplet discharging apparatus of claim 5, wherein
the first camera acquires the third image at a fourth timing later than the first timing,
the inkjet head discharges the second droplet at a fifth timing later than the fourth timing, and
the second camera acquires the fourth image at a sixth timing later than the fifth timing.

7. The droplet discharging apparatus of claim 1, wherein the first camera, the inkjet head, and the second camera are physically connected to each other and fixed.

8. The droplet discharging apparatus of claim 1, wherein each of the first camera and the second camera is a line scan camera that photographs in units of lines.

9. The droplet discharging apparatus of claim 1, wherein each of the first camera and the second camera is an area scan camera that photographs in units of areas.

10. The droplet discharging apparatus of claim 1, further comprising:
a controller communicating with the image processor and stopping a printing process in case that the droplet discharging apparatus determines that the first droplet is not seated at the first target position.

11. The droplet discharging apparatus of claim 1, wherein a direction in which the first camera and the second camera photograph is a third direction perpendicular to the substrate.

12. The droplet discharging apparatus of claim 11, further comprising:
an illumination including:
a light source irradiating light in a direction intersecting the third direction; and
a half mirror reflecting the light in the third direction.

13. The droplet discharging apparatus of claim 12, wherein
the second camera receives a first reflected light reflected by the substrate,
the second camera receives a second reflected light reflected by the first droplet,
the first reflected light has a first intensity, and
the second reflected light has a second intensity greater than the first intensity.

14. The droplet discharging apparatus of claim 1, wherein
the substrate further includes a second target position spaced apart from the first target position in the second direction,
a second boundary of the second target position is spaced apart from the boundary of the first target position in the second direction.

15. The droplet discharging apparatus of claim 1, wherein the boundary defining the enclosed size has substantially a same size as the diameter size of the first droplet.

16. A droplet discharging method comprising:
moving a substrate including a first target position in a first direction;
acquiring a first image corresponding to the first target position of the substrate at a first timing;
discharging a first droplet to the first target position of the substrate at a second timing;
acquiring a second image corresponding to the first target position of the substrate at a third timing; and
comparing the first image and the second image to inspect a discharge state of the first droplet and determine if the first droplet is seated within a boundary of the first target position, the boundary defining an enclosed area corresponding to a diameter size of the first droplet when seated on the substrate.

17. The droplet discharging method of claim 16, wherein at the first timing, the second timing, and the third timing, the substrate is being moved in the first direction.

18. The droplet discharging method of claim 16, wherein
the first image is an image corresponding to the first target position before the first droplet is discharged, and
the second image is an image corresponding to the first target position after the first droplet is discharged.

19. The droplet discharging method of claim 16, further comprising:
stopping a printing process in case that the first droplet is not seated at the first target position.

20. The droplet discharging method of claim 16, further comprising:
acquiring a third image corresponding to a second target position of the substrate, the second target position spaced apart from the first target position in a second direction opposite to the first direction;
discharging a second droplet to the second target position of the substrate;
acquiring a fourth image corresponding to the second target position of the substrate; and
comparing the third image and the fourth image to inspect a discharge state of the second droplet.

* * * * *